United States Patent
Inoue et al.

(10) Patent No.: US 8,748,755 B2
(45) Date of Patent: Jun. 10, 2014

(54) ELECTRONIC COMPONENT, ELECTRONIC DEVICE, AND METHOD FOR MANUFACTURING THE ELECTRONIC COMPONENT

(75) Inventors: Kazunori Inoue, Tokyo (JP); Tsutomu Miyashita, Tokyo (JP); Kazuhiro Matsumoto, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 178 days.

(21) Appl. No.: 13/419,253

(22) Filed: Mar. 13, 2012

(65) Prior Publication Data

US 2012/0241211 A1 Sep. 27, 2012

(30) Foreign Application Priority Data

Mar. 22, 2011 (JP) .................................. 2011-063365

(51) Int. Cl.
*H01L 23/28* (2006.01)
(52) U.S. Cl.
USPC .................... 174/523; 257/730; 257/788
(58) Field of Classification Search
CPC ..................................................... H01L 23/315
USPC .................... 174/523; 257/730, 788
See application file for complete search history.

(56) References Cited

U.S. PATENT DOCUMENTS

| 5,120,678 | A | * | 6/1992 | Moore et al. ..................... 29/840 |
| 5,258,650 | A | * | 11/1993 | Polak et al. .................. 257/788 |
| 5,386,342 | A | * | 1/1995 | Rostoker ....................... 361/749 |
| 5,590,462 | A | * | 1/1997 | Hundt et al. ................... 29/840 |
| 5,700,981 | A | * | 12/1997 | Tuttle et al. ................... 174/250 |
| 5,962,810 | A | * | 10/1999 | Glenn ........................... 174/524 |
| 5,973,263 | A | * | 10/1999 | Tuttle et al. ................... 174/523 |
| 6,614,108 | B1 | * | 9/2003 | Sanftleben et al. ........... 257/710 |
| 7,427,806 | B2 | * | 9/2008 | Arndt et al. ................... 257/682 |
| 2002/0060084 | A1 | * | 5/2002 | Hilton et al. ................. 174/52.1 |
| 2003/0183950 | A1 | * | 10/2003 | Bolken ......................... 257/786 |

FOREIGN PATENT DOCUMENTS

| JP | 9-174786 A | 7/1997 |
| JP | 9-326447 A | 12/1997 |
| JP | 2008-103559 A | 5/2008 |
| JP | 2008-227748 A | 9/2008 |

* cited by examiner

*Primary Examiner* — Hung Ngo
(74) *Attorney, Agent, or Firm* — Chen Yoshimura LLP

(57) ABSTRACT

An electronic component includes: a substrate; a functional portion provided on the substrate; an interconnection line provided on the substrate and electrically connected to the functional portion; a metal wall provided on the substrate so as to surround the functional portion and the interconnection line; and a seal portion that contacts the metal wall and covers the functional portion and the interconnection line so as to define a cavity above the functional portion, the seal portion being made of liquid crystal polymer.

13 Claims, 18 Drawing Sheets

ELECTRONIC COMPONENT, ELECTRONIC DEVICE, AND METHOD FOR MANUFACTURING THE ELECTRONIC COMPONENT

CROSS-REFERENCE TO RELATED APPLICATION

This application is based upon and claims the benefit of priority of the prior Japanese Patent Application No. 2011-063365, filed on Mar. 22, 2011, the entire contents of which are incorporated herein by reference.

FIELD

A certain aspect of the present invention relates to an electronic component, an electronic device, and a method for manufacturing the electronic component.

BACKGROUND

An acoustic wave device is used as a filter, a duplexer or the like in mobile communication terminals. Acoustic wave resonators include a surface acoustic wave (SAW) resonator using a surface acoustic wave, a boundary acoustic wave resonator using a boundary acoustic wave, a piezoelectric thin-film resonator using a piezoelectric thin-film. A film bulk acoustic wave resonator (FBAR) is an exemplary piezoelectric thin-film resonator. A functional portion for excitation of acoustic waves includes an electrode such as an interdigital transducer (IDT) in the SAW device, and is a portion in which electrodes face each other through a piezoelectric thin-film. A substrate on which an acoustic wave element is formed may be sealed with resin or the like for the purpose of downsizing the acoustic wave device and protecting the acoustic wave element.

Japanese Patent Application Publication No. 2008-227748 (Document 1) discloses sealing with epoxy resin. The material for sealing may be polyimide, for example. However, polyimide has a high hygroscopic property and may not protect the acoustic wave element sufficiently. Japanese Patent Application Publication No. 9-326447 (Document 2), Japanese Patent Application Publication No. 9-174786 (Document 3) and Japanese Patent Application Publication No. 2008-103559 (Document 4) disclose sealing with liquid crystal polymer. Liquid crystal polymer has a low hygroscopic property, as compared with polyimide resin, and is thus suitable for the sealing substance. As described in paragraph 0002 of Document 3, in a case where the sealing substance is formed into a sheet, the liquid crystal polymer is oriented in the sheet extruding direction in which a sheet is extruded by rollers of a machine. The liquid crystal sheet has physical properties that greatly depend on the orientation direction. Generally, the hygroscopic property and the adhesive property are those obtained under the condition that the orientation direction corresponds to the sheet extruding direction.

However, the combination of liquid crystal polymer and the base member to which liquid crystal polymer is bonded or the conditions in adhesion may not have the desired adhesive property. If the adhesive property is insufficient, moisture may enter through the interface between the liquid crystal polymer and the base member, and the electronic components may not be protected sufficiently (see paragraph 0002 of Document 4).

SUMMARY OF THE INVENTION

According to an aspect of the present invention, there is provided an electronic component including: a substrate; a functional portion provided on the substrate; an interconnection line provided on the substrate and electrically connected to the functional portion; a metal wall provided on the substrate so as to surround the functional portion and the interconnection line; and a seal portion that contacts the metal wall and covers the functional portion and the interconnection line so as to define a cavity above the functional portion, the seal portion being made of liquid crystal polymer.

DETAILED DESCRIPTION

Embodiments of the invention are now described with reference to the accompanying drawings.

First Embodiment

Figure 1A:
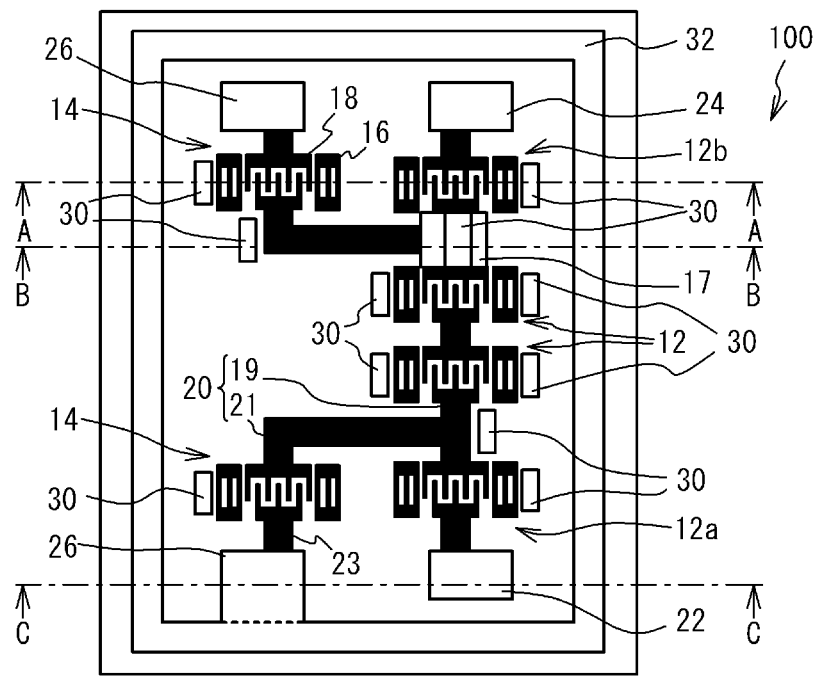
FIGS. 1A and 1B are plan views of a ladder type filter in accordance with a first embodiment.
Figure 1B:
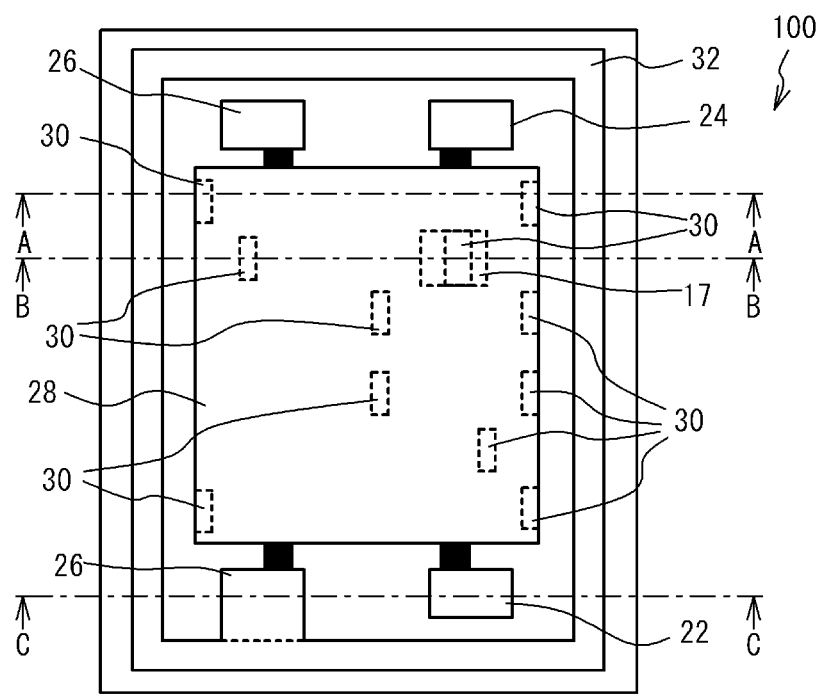
Figure 2:
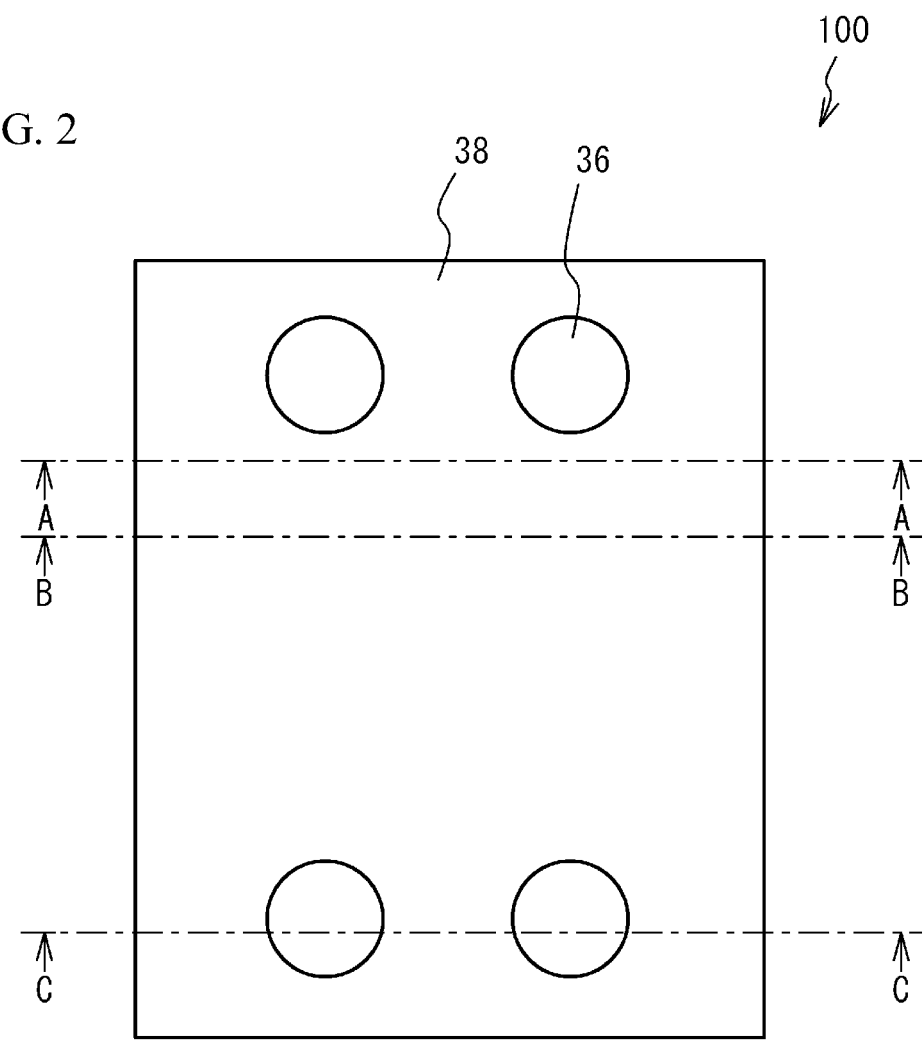
FIG. 2 is a plan view of the ladder type filter of the first embodiment.

FIGS. 1A, 1B and 2 are plan views of a ladder type filter in accordance with a first embodiment. In FIG. 1A, the ladder type filter is seen through a seal portion and a metal plate illustrated in FIG. 2. In FIG. 1B, the ladder type filter is seen through the seal portion in FIG. 2.

As illustrated in FIGS. 1A, 1B and 2, a ladder type filter 100 of the first embodiment includes a piezoelectric substrate 10, series resonators 12, parallel resonators 14, signal lines (interconnection lines) 20, ground lines 23, a transmission terminal 22, an antenna terminal 24, ground terminals 26, a metal plate 28, support posts 30, a metal wall 32, solder balls 36 and a seal portion 38.

As illustrated in FIG. 1A, on the upper surface of the piezoelectric substrate 10, provided are reflection electrodes 16, an IDT 18, signal lines 20, the ground lines 23, the support posts 30 and the metal wall 32. The IDT 18 is composed of a pair of comb-finger electrodes, and excites acoustic waves. The reflection electrodes 16 are provide at both sides of the IDT 18 in a direction of propagation of the acoustic waves. Each of the series resonators 12 and the parallel resonators 14 is composed of the reflection electrodes 16 and the IDT 18. The functional portions of the ladder type filter include acoustic SAW elements. For example, the four series resonators 12 and the two parallel resonators 14 are arranged in a ladder form. The series resonators 12 are connected in series with each other by series lines 19. The series resonators 12 and the parallel resonators 14 are connected together by parallel lines 21. A series resonator 12a, which is one of the four series resonators 12, is electrically connected to the transmission terminal 22 via the corresponding series line 19. A series resonator 12b out of the four series resonators 12 is electrically connected to the antenna terminal 24 via the corresponding series line 19. The parallel resonators 14 are electrically connected to the ground terminals 26 via the ground lines 23. A signal such as an RF signal or a high frequency signal is applied to the transmission terminal 22. The signal lines 20 transmit the RF signal. The antenna terminal 24 connects the ladder type filter 100 and an antenna to each other.

The support posts 30 are arranged at both sides of each of the two series resonators 12 other than the series resonators 12a and 12b and at both sides of an arrangement of the series resonator 12a and one of the parallel resonators 14 arranged in a line, and are arranged at both sides of an arrangement of the series resonator 12b and the other parallel resonator 14 arranged in a line. Further, the support posts 30 are arranged in positions along some series lines 19 and some parallel lines 21, and are arranged on one of the series lines 19. The support posts 30 are spaced apart from the series resonators 12, the parallel resonators 14, the signal lines 20 and the ground lines 23. The metal wall 32 is provided in an outer periphery of the piezoelectric substrate 10 so as to surround the series resonators 12, the parallel resonators 14, the signal lines 20, the ground lines 23, the transmission terminal 22, the antenna terminal 24, the ground terminals 26 and the support posts 30. The ground terminals 26 and the metal wall 32 are electrically connected together.

As illustrated in FIG. 1B, the metal plate 28 is provided on or above the series resonators 12, the parallel resonators 14, the signal lines 20, the ground lines 23 and the support posts 30. The metal plate 28 is supported by the support posts 30, and is spaced apart from the transmission terminal 22, the antenna terminal 24, the ground terminals 26 and the metal wall 32.

As illustrated in FIG. 2, the seal portion 38 is provided on the whole piezoelectric substrate 10. The functional portions of the series resonators 12 and the parallel resonators 14, the signal lines 20 and the ground lines 23 are sealed with the seal portion 38. The solder balls 36 are provided on the seal portion 38. As will be described later, each of the solder balls 36 is included in any of the transmission terminal 22, the antenna terminal 24 and the ground terminals 26.

Figure 3A:
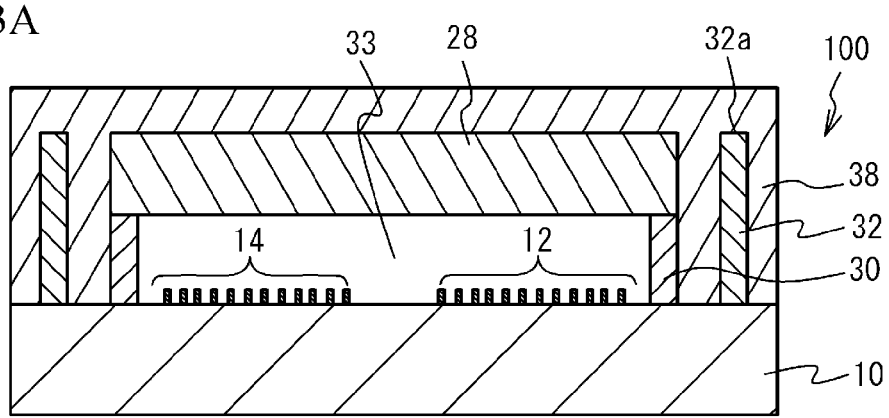
FIGS. 3A through 3C are cross-sectional views of the ladder type filter of the first embodiment.
Figure 3B:
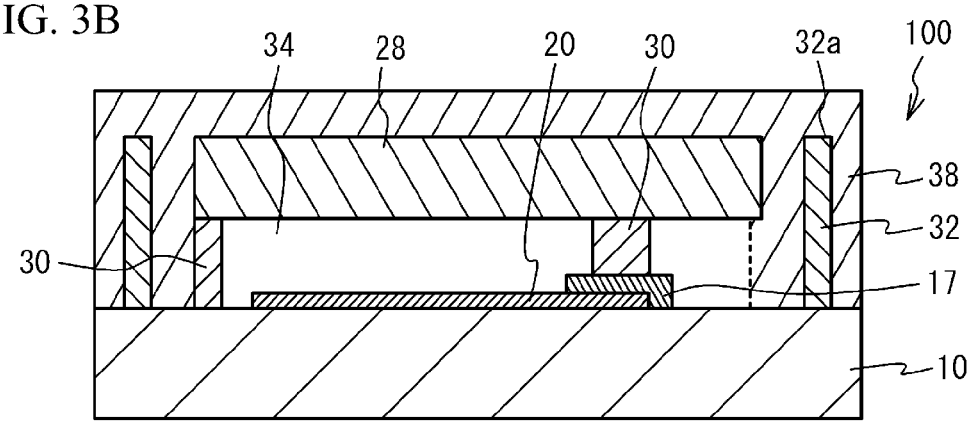
Figure 3C:
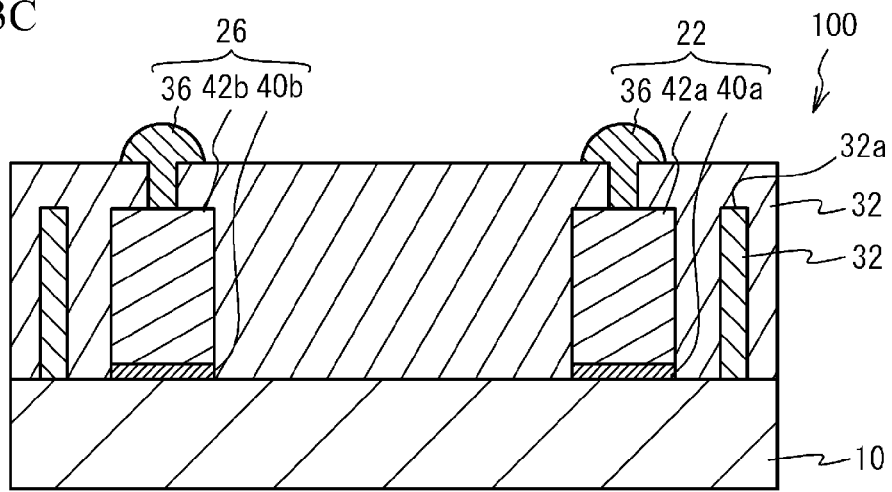

A further description of the ladder type filter 100 is given with reference to cross-sectional views. FIGS. 3A through 3C are cross-sectional views of the ladder type filter in accordance with the first embodiment. FIG. 3A is a cross-sectional view taken along a line A-A in FIG. 2, FIG. 3B is a cross-sectional view taken along a line B-B in FIG. 2, and FIG. 3C is a cross-sectional view taken along a line C-C in FIG. 2.

Referring to FIG. 3A, the series resonators 12 and the parallel resonators 14 are exposed to a cavity 33. The metal plate 28 is provided above the series resonators 12 and the parallel resonators 14, and is supported by the support posts 30. The support posts 30 have a height that defines the cavity 33 in corporation with the metal plate 28. The metal plate 28 covers the series resonators 12 and the parallel resonators 14 so that the cavity 33 is defined above the series resonators 12 and the parallel resonators 14. The height of the cavity 33 does not prevent excitation of the acoustic waves. The support posts 30 may have a height of, for example, 1~30 μm. The seal portion 38 is in contact with and is bonded to the side and upper surfaces of the metal plate 28, the side surfaces of the support posts 30 and the side and upper surfaces 32a of the metal wall 32. The metal plate 28 has the same height as the metal wall 32 with respect to the upper surface of the piezoelectric substrate 10.

As illustrated in FIG. 3B, an insulative layer 17 is provided on one of the signal lines 20, and one of the support posts 30 is provided on the insulative layer 17. A spacing 34 is formed between the signal lines 20 and the metal plate 28. The signal lines 20 are spaced apart from the metal plate 28 and the support posts 30 and are isolated therefrom.

As illustrated in FIG. 3C, the transmission terminal 22 includes an underlying layer 40a, a post terminal 42a and one solder ball 36. The underlying layer 40a is provided on the piezoelectric substrate 10, and the post terminal 42a is provided on the underlying layer 40a. The solder ball 36 that is exposed to the sealing portion 38 is provided on the post terminal 42a. The post terminal 42a has the same height as the metal wall 32 and the metal plate 28 with respect to the piezoelectric substrate 10. The ground terminal 26 includes an underlying layer 40b, a post terminal 42b and one solder ball 36. The transmission terminal 22, the antenna terminal 24 and the ground terminals 26 are terminals that pass through the seal portion 38.

The piezoelectric substrate 10 is made of a piezoelectric material such as $LiTaO_3$ or $LiNbO_3$. A metal such as aluminum is used to form the series resonators 12, the parallel resonators 14, the signal lines 20, the ground lines 23, the transmission terminal 22, the antenna terminal 24, the ground terminals 26, and the underlying layers 40a and 40b. A metal such as copper is used to form the metal plate 28, the support posts 30, and the post terminals 42a and 42b. The solder balls 36 may be formed by solder including tin and silver (SnAg). The seal portion 38 may be made of liquid crystal polymer.

The insulative layer 17 may be formed by an insulator such as silicon dioxide (SiO$_2$), silicon nitride (SiN), alumina (Al$_2$O$_3$), or organic material.

A description is now given of a method for manufacturing the ladder type filter in accordance with the first embodiment. FIGS. 4A, 4B, 7A, 7B, 10A, 10B, 13A, 13B and FIG. 16 are plan views that illustrate a method for manufacturing the ladder type filter in accordance with the first embodiment. FIGS. 5A through 6C, 8A through 9C, 11A through 12C, 14A through 15, and 17A through 17C are cross-sectional views that illustrate the manufacturing method.

Figure 4A:
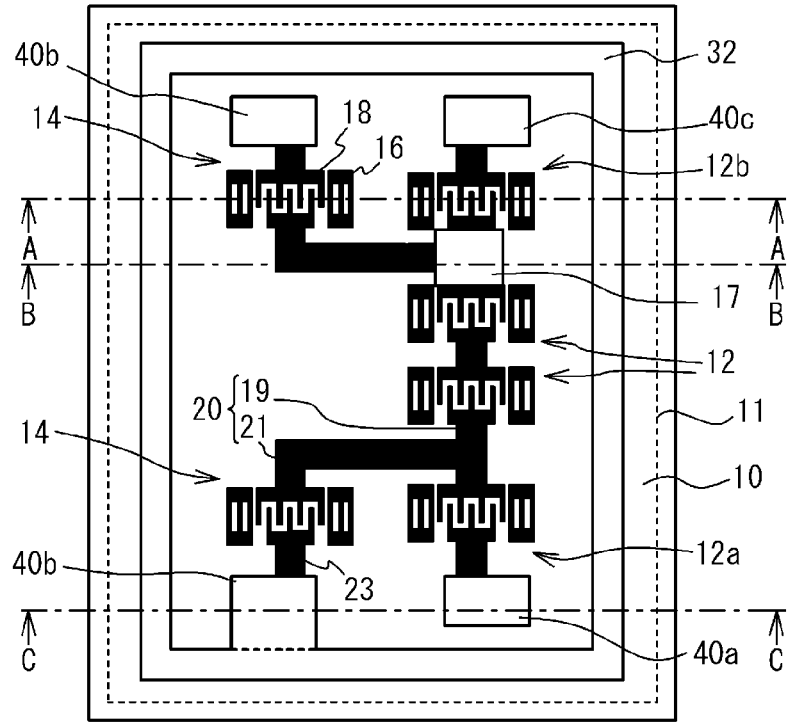
FIGS. 4A and 4B are plan views that illustrate a method for manufacturing the ladder type filter in accordance with the first embodiment.
Figure 5A:
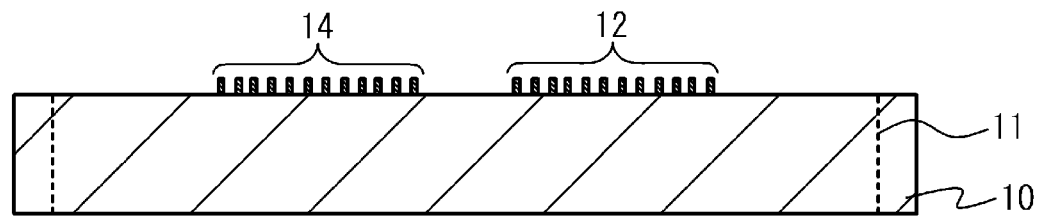
FIGS. 5A through 5C are cross-sectional views of the method for manufacturing the ladder type filter in accordance with the first embodiment.
Figure 5B:
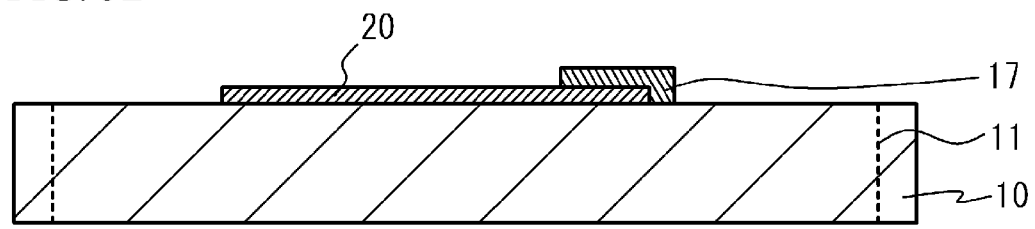
Figure 5C:
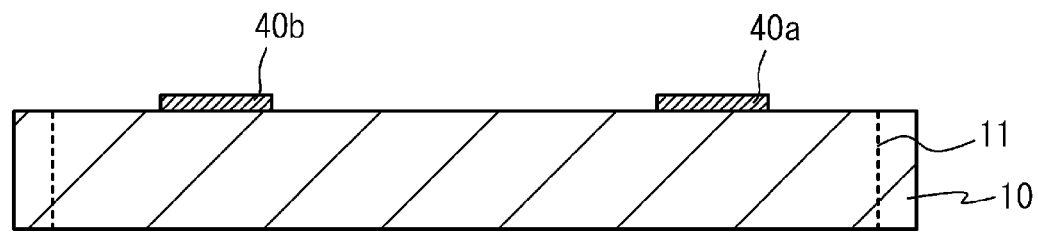

FIG. 5A is a cross-sectional view taken along a line A-A in FIG. 4A, FIG. 5B is a cross-sectional view taken along a line B-B in FIG. 4A, and FIG. 5C is a cross-sectional view taken along a line C-C in FIG. 4A. As illustrated in FIGS. 4A and 5A through 5C, a metal layer made of a metal such as aluminum is provided on the upper surface of the piezoelectric substrate 10 (a wafer) in a wafer form by deposition or sputtering, for example. By etching or liftoff, for example, the metal layer is patterned into the reflection electrodes 16, the IDTs 18, the signal lines 20, the ground lines 23, the underlying layers 40a and 40b, and an underlying layer 40c. The underlying layer 40c is a layer included in the antenna terminal 24. In this way, the series resonators 12 and the parallel resonators 14 are formed. The insulative layer 17 is provided on part of the upper surface of one of the signal lines 20 (more particularly, one of the series lines 19). In a later process, the wafer is divided into multiple piezoelectric substrates 10 by dicing along dicing lines 11.

Figure 4B:
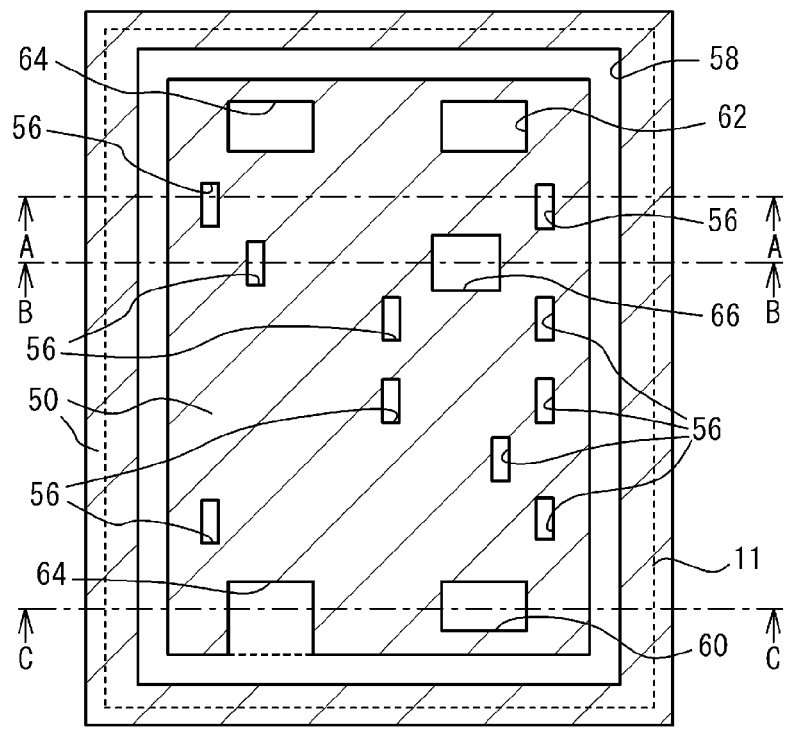
Figure 6A:
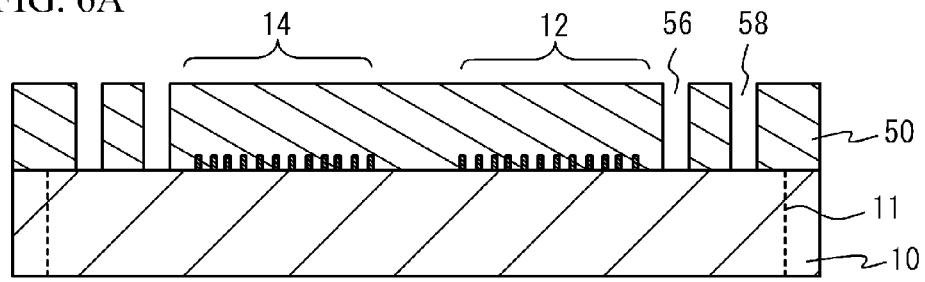
FIGS. 6A through 6C are cross-sectional views of the method for manufacturing the ladder type filter in accordance with the first embodiment.
Figure 6B:
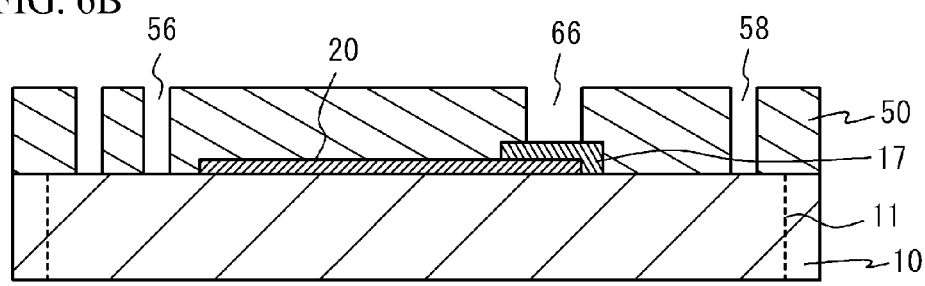
Figure 6C:
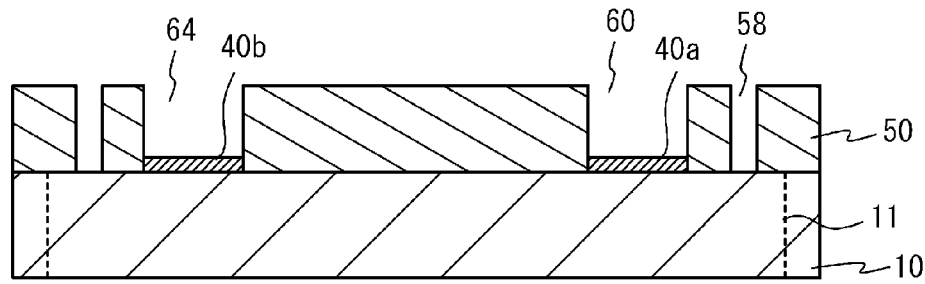

FIG. 6A is a cross-sectional view taken along a line A-A in FIG. 4B, FIG. 6B is a cross-sectional view taken along a line B-B in FIG. 4B, and FIG. 6C is a cross-sectional view taken along a line C-C in FIG. 4B. Referring to FIGS. 4B and 6A through 6C, a photoresist 50 (first resist) is provided on the piezoelectric substrate 10. In FIG. 4B, an area in which the photoresist 50 is provided is illustrated by oblique lines. The photoresist 50 covers the series resonators 12, the parallel resonators 14, the signal lines 20 and the ground lines 23. Further, the photoresist 50 has openings 56, an opening 58, an opening 60, an opening 62, openings 64, and an opening 66. The openings 56 and 66 are formed in areas in which the support posts 30 are to be formed. The opening 58 is formed in an area in which the metal wall 32 is to be formed. The opening 60 is formed in an area in which the post terminal 42a is to be formed. The opening 62 is provided in an area in which the post terminal 42c is to be formed as will be described later. The opening 64 is provided in an area in which the post terminal 42b is to be formed. When the piezoelectric substrate 10 is viewed from the top, the openings 58 and 64 communicate with each other. The piezoelectric substrate 10 is exposed in the openings 56 and 58. The underlying layer 40a is exposed in the opening 60, and the underlying layer 40c is exposed in the opening 62, the underling layer 40b being exposed in the opening 64. The insulative layer 17 is exposed in the opening 66. The photoresist 50 may have a thickness of 1~30 μm, for example.

Figure 7A:
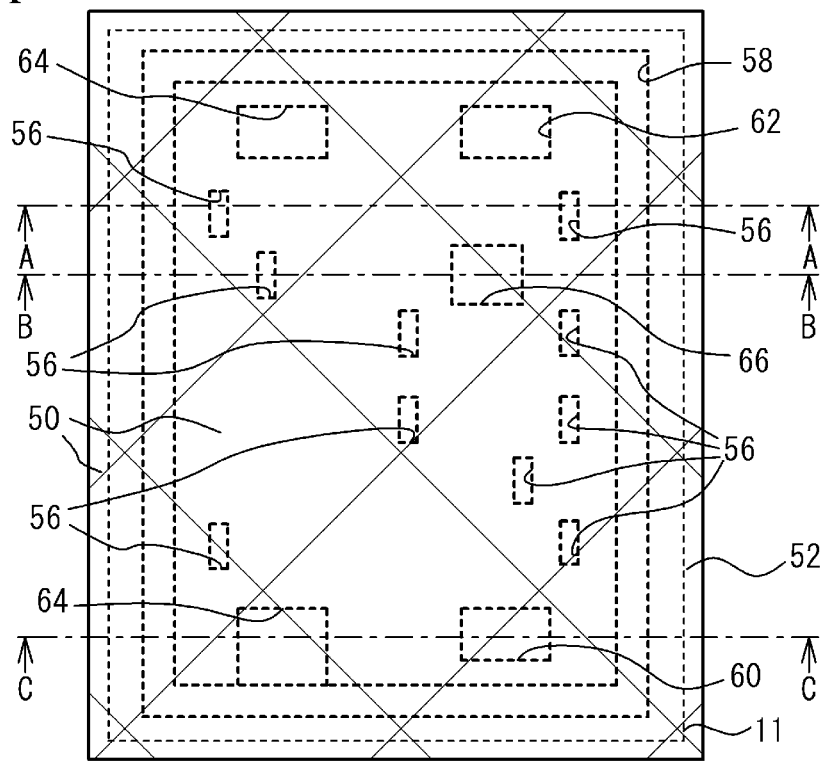
FIGS. 7A and 7B are plan views of the method for manufacturing the ladder-type filter in accordance with the first embodiment.
Figure 8A:
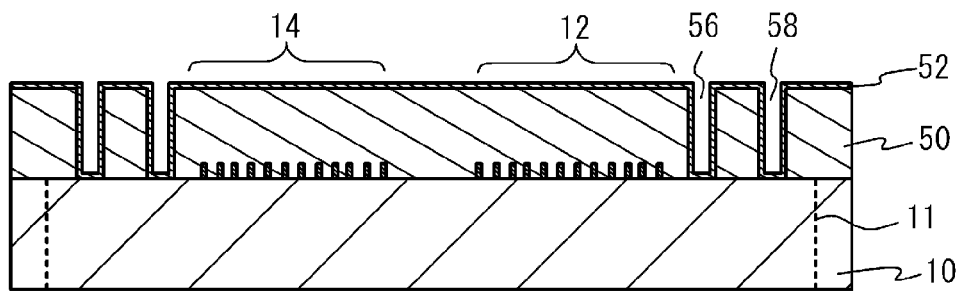
FIGS. 8A through 8C are cross-sectional views of the method for manufacturing the ladder type filter in accordance with the first embodiment.
Figure 8B:
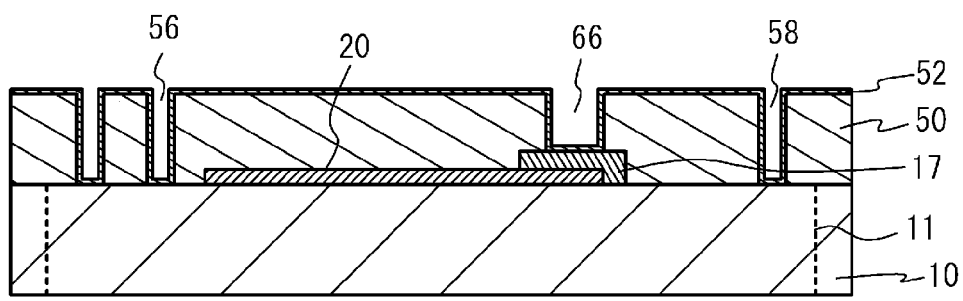
Figure 8C:
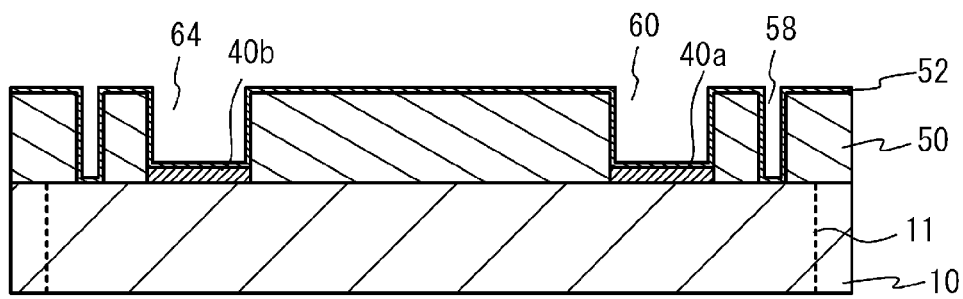

FIG. 8A is a cross-sectional view taken along a line A-A in FIG. 7A, FIG. 8B is a cross-sectional view taken along a line B-B in FIG. 7A, and FIG. 8C is a cross-sectional view taken along a line C-C in FIG. 7A. Referring to FIGS. 7A and 8A through 8C, a seed metal 52 is provided on the whole surface of the piezoelectric substrate 10 by sputtering or deposition, for example. In FIG. 7A, an area in which the seed metal 52 is provided is indicated by crossing oblique lines. The seed metal 52 contacts an area on the piezoelectric substrate 10 in the absence of the photoresist 50, the underlying layers 40a and 40b, and the upper and side surfaces of the photoresist 50. The seed metal 52 may be made of a metal such as aluminum.

Figure 7B:
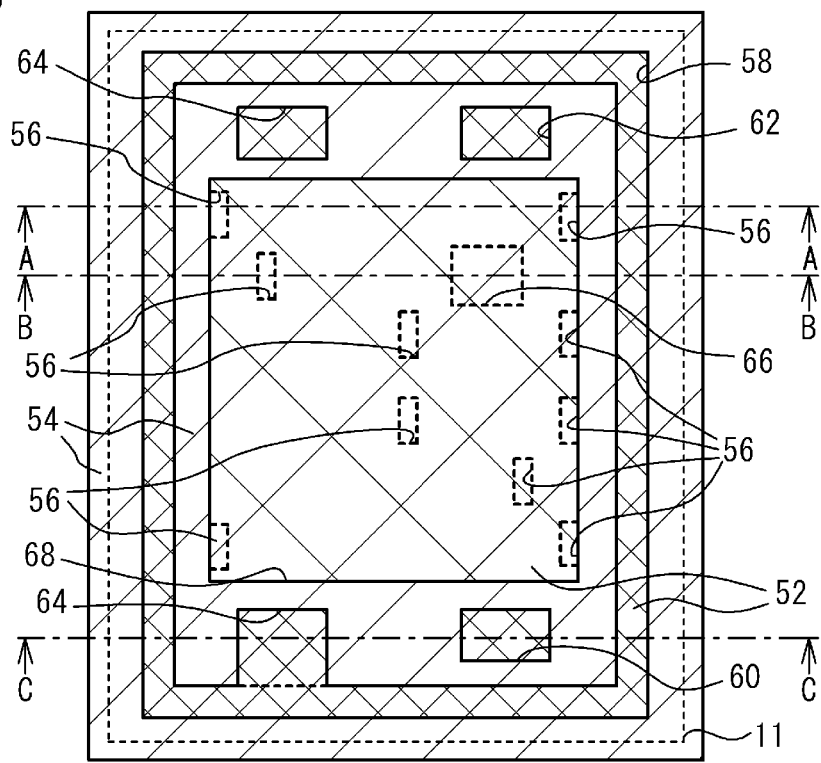
Figure 9A:
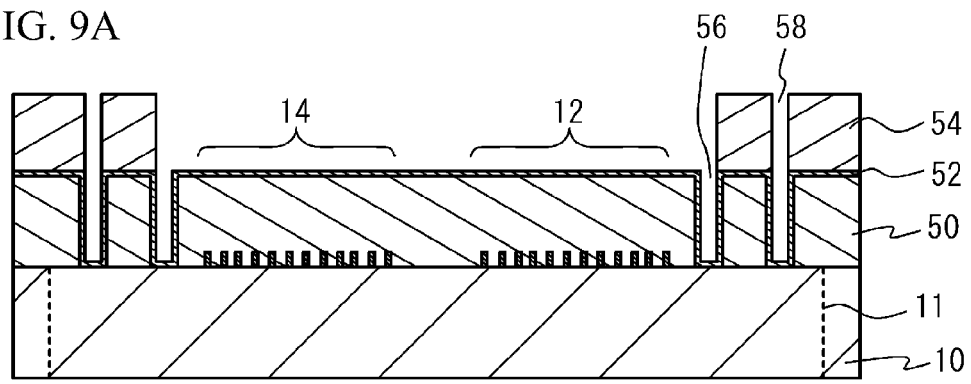
FIGS. 9A through 9C are cross-sectional views of the method for manufacturing the ladder type filter in accordance with the first embodiment.
Figure 9B:
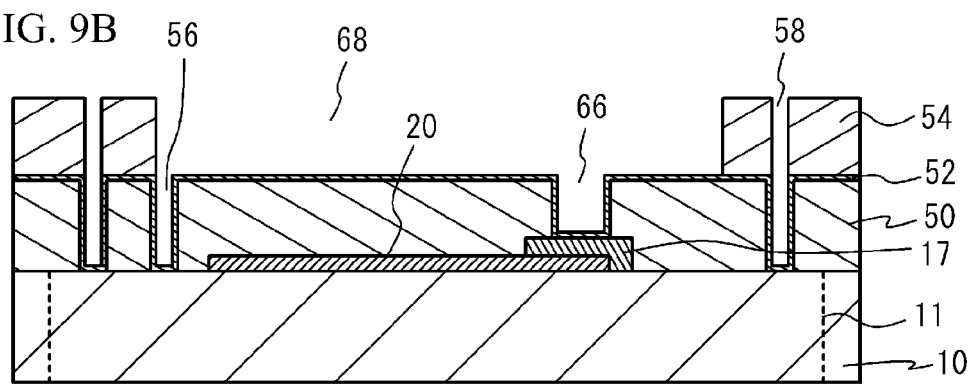
Figure 9C:
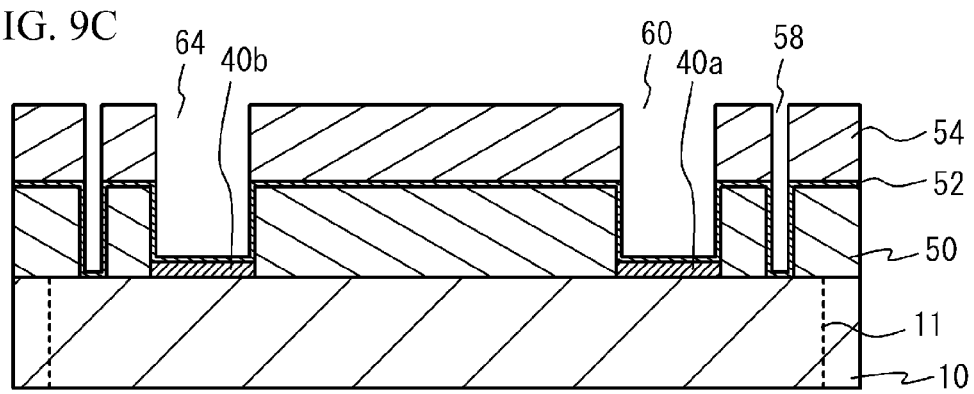

FIG. 9A is a cross-sectional view taken along a line A-A in FIG. 7B, FIG. 9B is a cross-sectional view taken along a line B-B in FIG. 7B, and FIG. 9C is a cross-sectional view taken along a line C-C in FIG. 7B. Referring to FIGS. 7B and 9A through 9C, a photoresist 54 (second resist) is provided on the seed metal 52. In FIG. 7B, an area in which the photoresist 54 is provided is indicated by oblique lines, and an area in which the seed metal 52 is provided is indicated by crossing oblique lines. The photoresist 54 does not have the openings 56, 58, 60, 62, 64 and 66. The photoresist 54 has an opening 68 in which the metal plate 28 is to be formed. The seed metal 52 is exposed in each opening. In the area in which the photoresist 54 is provided, the seed metal 52 is vertically sandwiched between the photoresist 50 and the photoresist 54.

Figure 10A:
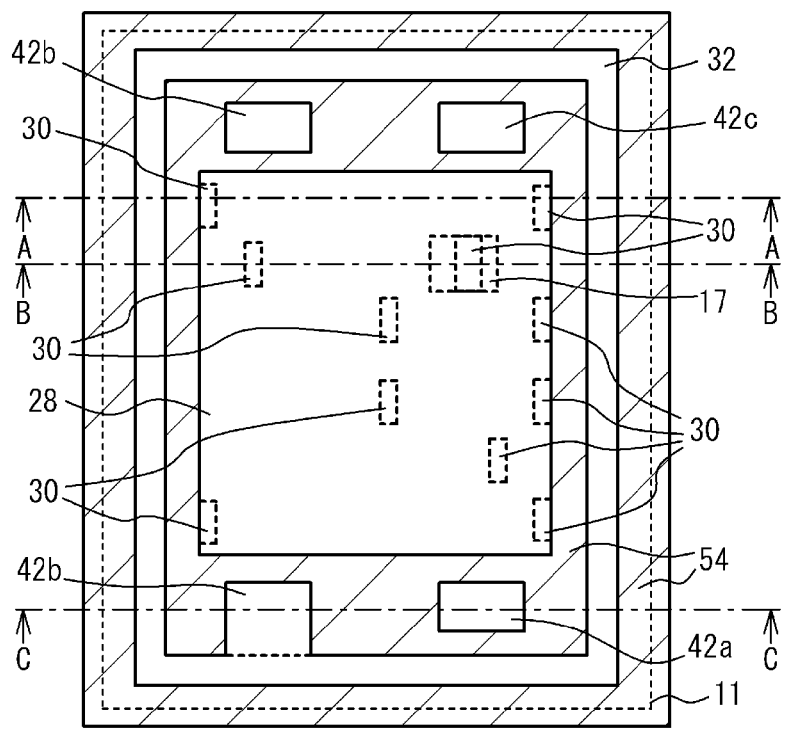
FIGS. 10A and 10B are plan views of the method for manufacturing the ladder type filter in accordance with the first embodiment.
Figure 11A:
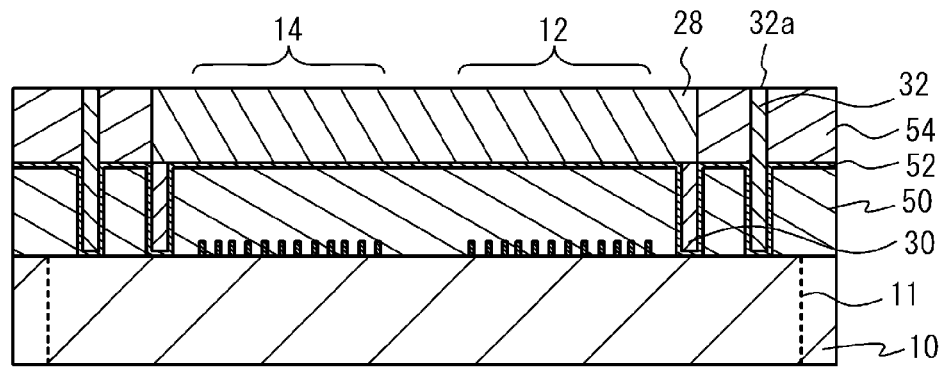
FIGS. 11A through 11C are cross-sectional views of the method for manufacturing the ladder type filter in accordance with the first embodiment.
Figure 11B:
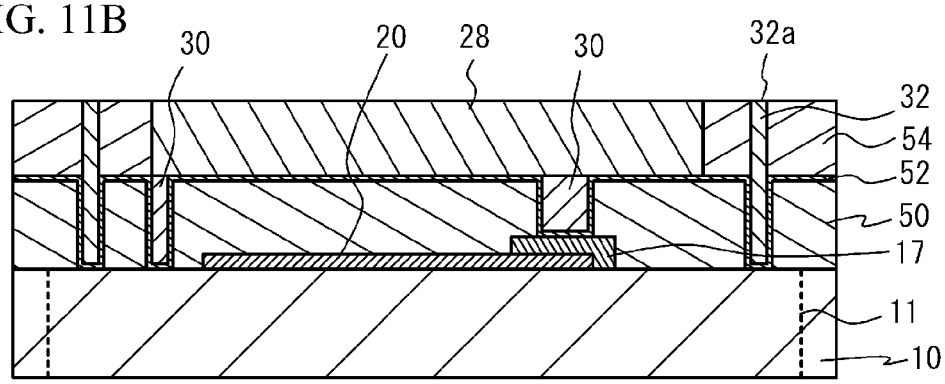
Figure 11C:
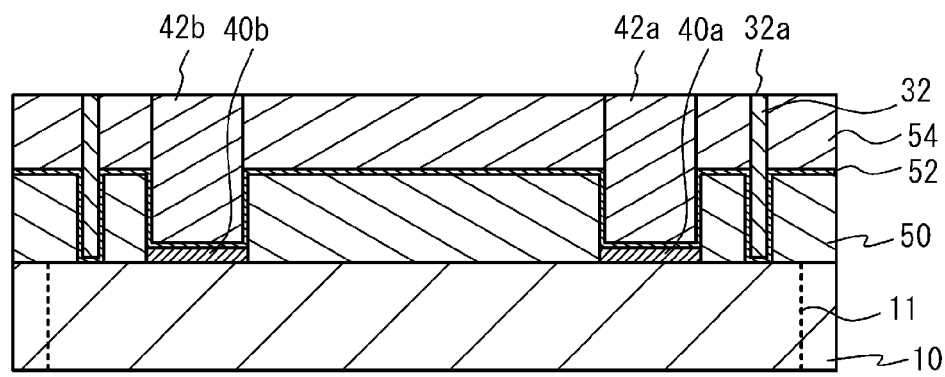

FIG. 11A is a cross-sectional view taken along a line A-A in FIG. 10A, FIG. 11B is a cross-sectional view taken along a line B-B in FIG. 10A, and FIG. 11C is a cross-sectional view taken along a line C-C in FIG. 10A. Referring to FIGS. 10A and 11A through 11C, the metal plate 28, the support posts 30, the metal wall 32, and the post terminals 42a and 42b, all of which are made of copper, are formed by electrolytic plating. The seed metal 52 functions as a feeder line in the electrolytic plating. The metal plate 28, the support posts 30, the metal wall 32, and the post terminals 42a and 42b are simultaneously formed by supplying current to the seed metal 52 once.

Figure 10B:
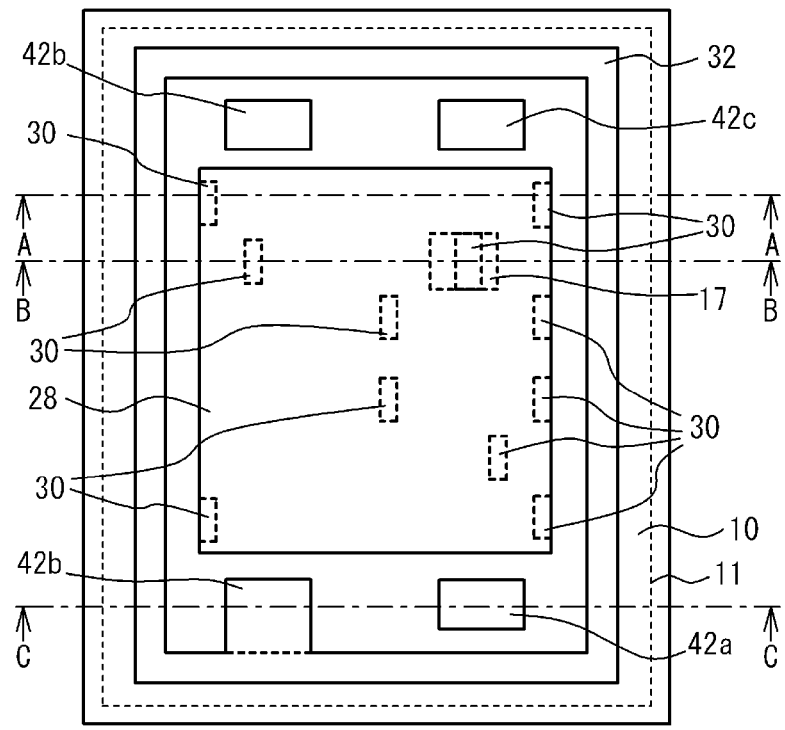
Figure 12A:
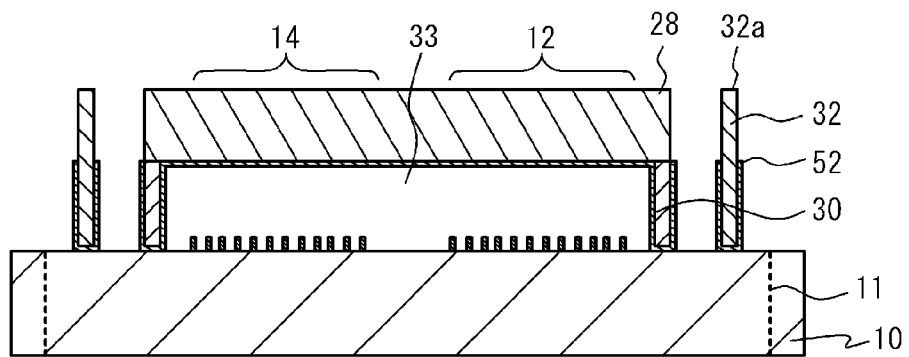
FIGS. 12A through 12C are cross-sectional views of the method for manufacturing the ladder type filter in accordance with the first embodiment.
Figure 12B:
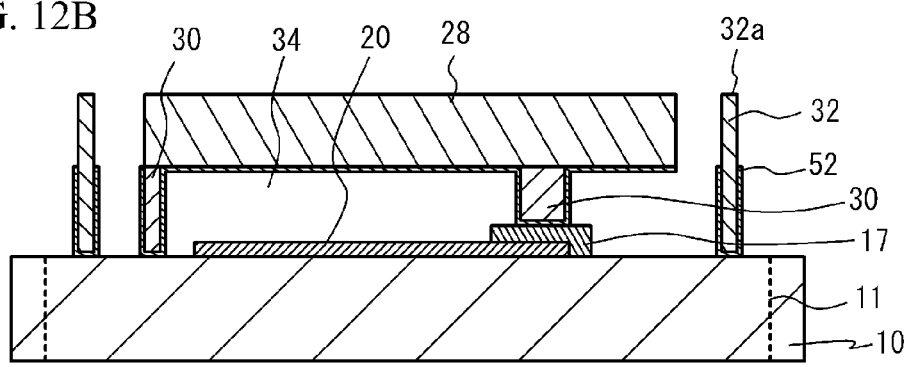
Figure 12C:
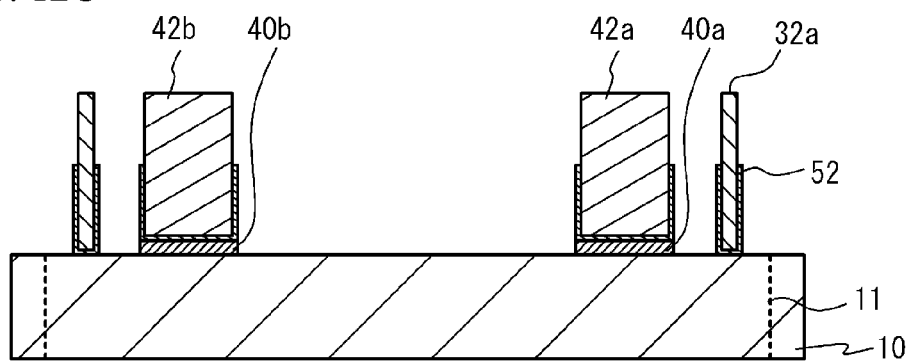

FIG. 12A is a cross-sectional view taken along a line A-A in FIG. 10B, FIG. 12B is a cross-sectional view taken along a line B-B in FIG. 10B, and FIG. 12C is a cross-sectional view taken along a line C-C in FIG. 10B. Referring to FIGS. 10B and 12A through 12C, the photoresist 50 and the photoresist 54 are removed by ultrasonic cleaning using resist removal liquid alone or together with oxygen plasma ashing. In this process, part of the seed metal 52 is removed. This process results in the cavity 33 between the series resonators 12 and the parallel resonators 14 and the metal plate 28. The spacing 34 is defined between the signal lines 20 and the metal plate 28.

Figure 13A:
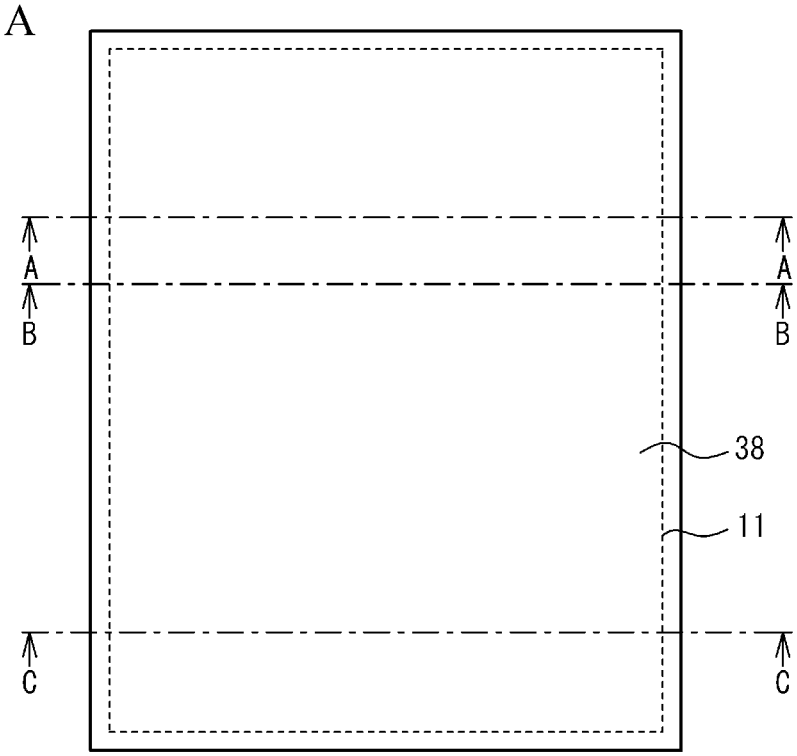
FIGS. 13A and 13B are plan views of the method for manufacturing the ladder type filter in accordance with the first embodiment.
Figure 14A:
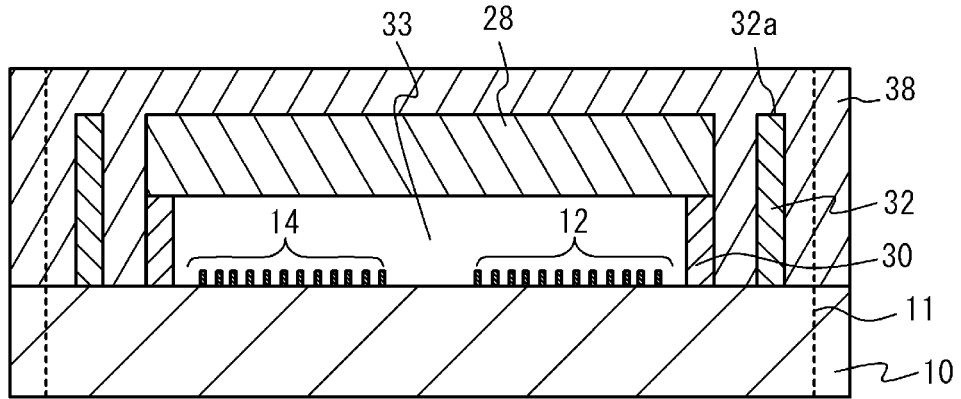
FIGS. 14A through 14C are cross-sectional views of the method for manufacturing the ladder type filter in accordance with the first embodiment.
Figure 14B:
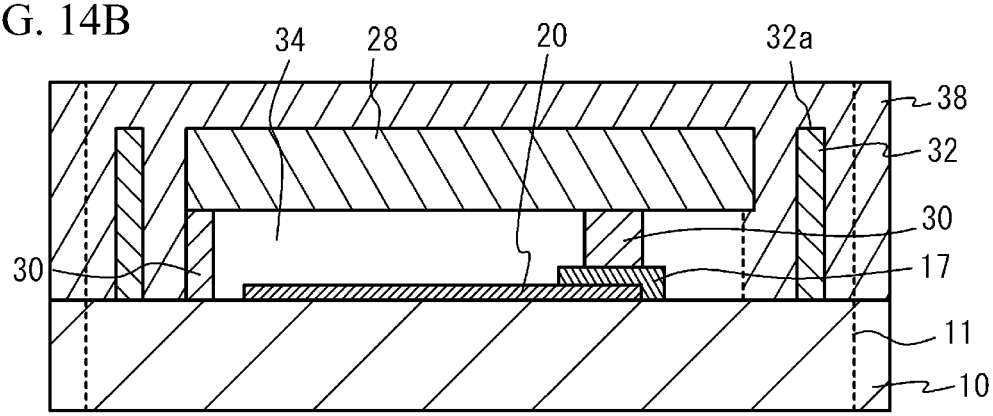
Figure 14C:
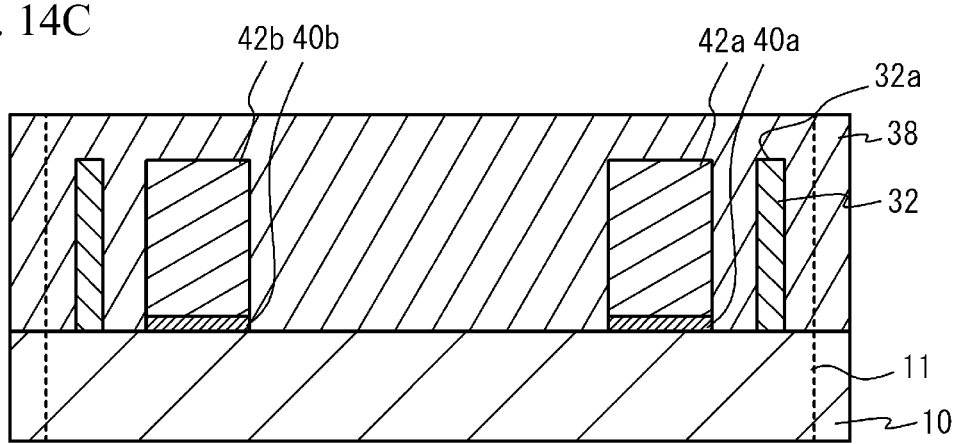

FIG. 14A is a cross-sectional view taken along a line A-A in FIG. 13A, FIG. 14B is a cross-sectional view taken along a line B-B in FIG. 13A, and FIG. 14C is a cross-sectional view taken along a line C-C in FIG. 13A. In these figures, the seed metal 52 is omitted from illustration because it is visually incorporated with the metal plate 28, the support posts 30, the metal wall 32, and the post terminals 42a and 42b. Referring to FIGS. 13A and 14A through 14C, the seal portion 38 is provided so as to cover the upper surface of the piezoelectric substrate 10. The step of providing the seal portion 38 may include disposing a liquid crystal polymer sheet on the piezoelectric substrate 10, and heating and pressurizing the sheet. The liquid crystal polymer sheet has thermoplasticity. Therefore, the liquid crystal polymer sheet heated and pressurized fills spacings between the support posts 30 and the metal wall 32, spacing between the post terminals 42a and 42b and the metal wall 32, and a spacing between the post terminals 42a and 42b. As described above, the liquid crystal polymer sheet is bonded to the metal plate 28, the metal wall 32 and the post terminals 42a and 42b by thermocompression, whereby the seal portion 38 is formed. Since liquid crystal polymer has high viscosity, it is prevented from flowing in the insides of the metal plate 28 and the support posts 30, and the cavity 33 can be secured. As the liquid crystal polymer sheet, "Vecstar" by Kuraray Co., LTD. or "BIAC" by Japan Gore Tex Incorporated may be used, for example.

Figure 13B:
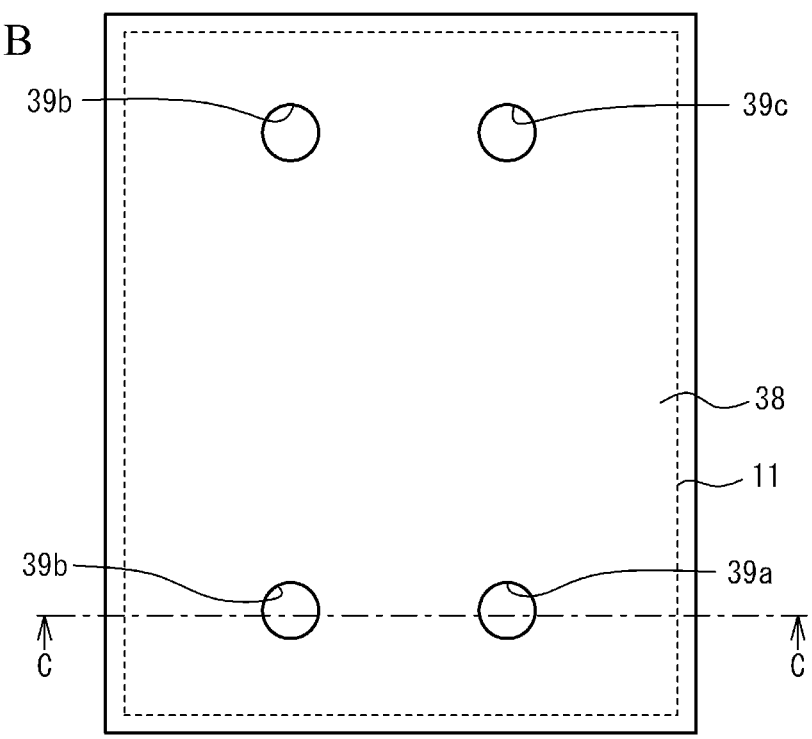
Figure 15:
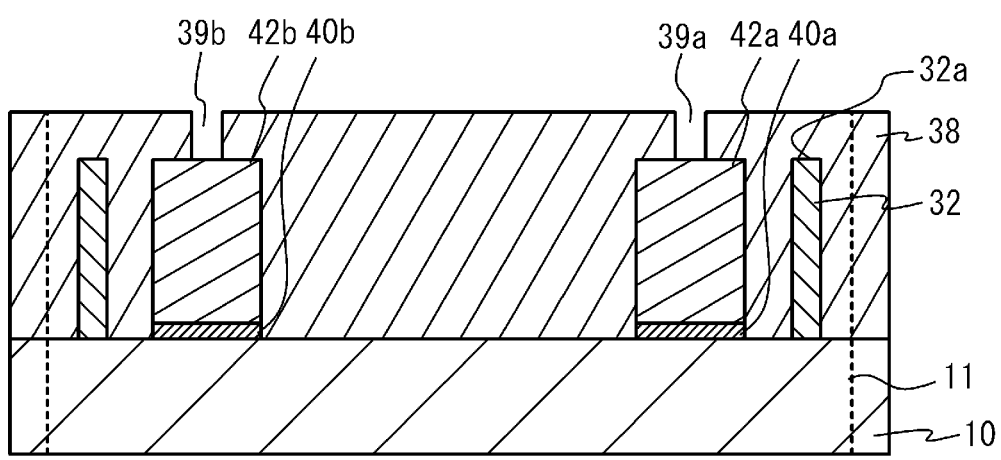
FIG. 15 is a cross-sectional view of the method for manufacturing the ladder type filter in accordance with the first embodiment.

FIG. 15 is a cross-sectional view taken along a line C-C in FIG. 13B. Referring to FIGS. 13B and 15, openings 39a, 39b and 39c are formed in the seal portion 38 by laser a trimming or desmear process, for example. As illustrated in FIG. 13B, the opening 39a is formed in an area in which the transmission terminal 22 is to be provided. The openings 39b are formed in an area in which the ground terminals 26 are to be provided. The opening 39c is formed in an area in which the antenna terminal 24 is to be provided. The post terminal 42a is exposed in the opening 39a. The post terminals 42b are exposed in the openings 39b. The post terminal 42c is exposed in the opening 39c.

Figure 16:
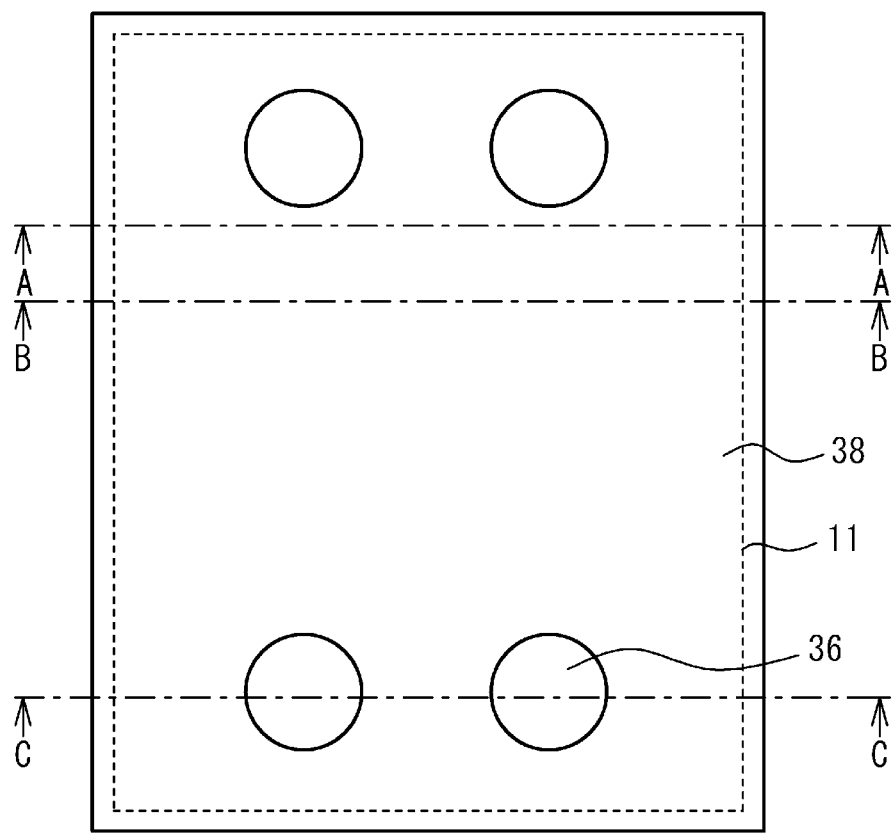
FIG. 16 is a cross-sectional view of the method for manufacturing the ladder type filter in accordance with the first embodiment.
Figure 17A:
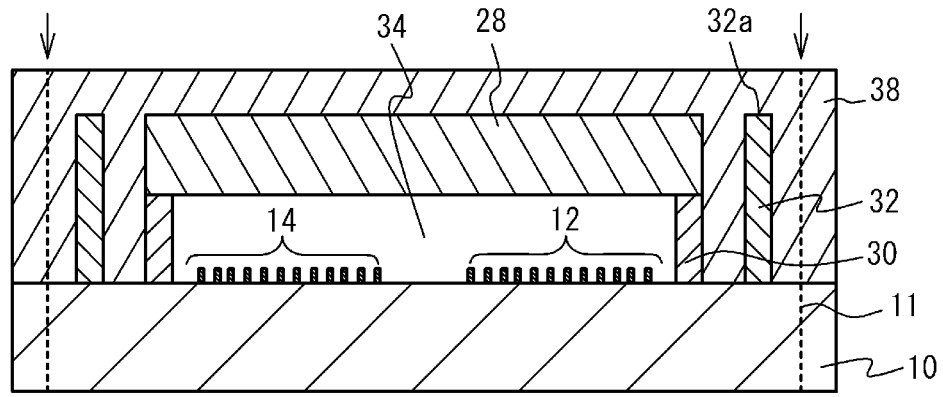
FIGS. 17A through 17C are cross-sectional views of the method for manufacturing the ladder type filter in accordance with the first embodiment.
Figure 17B:
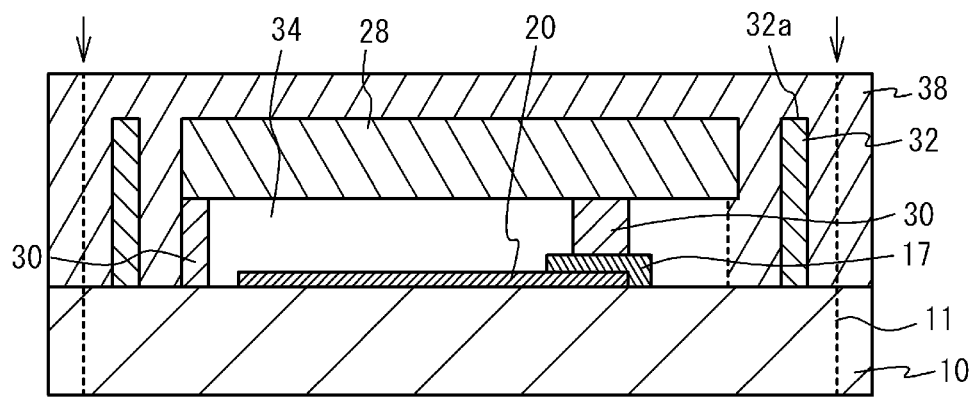
Figure 17C:
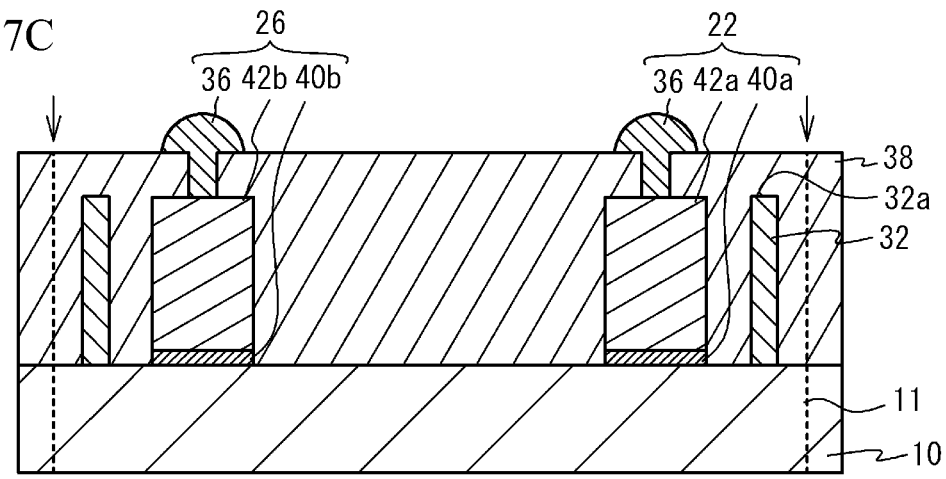

FIG. 17A is a cross-sectional view taken along a line A-A in FIG. 16, FIG. 17B is a cross-sectional view taken along a line B-B in FIG. 16, and FIG. 17C is a cross-sectional view taken along a line C-C in FIG. 16. Referring to FIGS. 16 and 17C, solder balls 36 are formed in the openings 39a, 39b and 39c by printing of solder paste and solder reflow, for example. As indicated by arrows in FIGS. 17A through 17C, the wafer is divided into multiple piezoelectric substrates 10 by dicing along dicing lines 11. Thus, multiple acoustic wave devices are produced from the wafer.

The ladder type filter 100 of the first embodiment is configured so that the metal wall 32 surrounds the series resonators 12, the parallel resonators 14, the signal lines 20, the ground lines 23, the transmission terminal 22, the antenna terminal 24 and the ground terminals 26, and that the seal portion 38 made of liquid crystal polymer contacts the metal wall 32. It is thus possible to secure a high adhesive property between the metal wall 32 an the seal portion 38. As a result, it is possible to suppress entering of moisture through the interface between the metal wall 32 and the seal portion 38 and to improve the humidity resistance of the ladder type filter.

Particularly, in a case where the metal wall 32 is made of copper or an alloy having copper as the main component, the adhesive property between the seal portion 38 and the metal wall 32 can be further improved. The metal wall 32 may be made of another metal that realizes a high adhesive property to the seal portion 38. Such a metal is aluminum, for example.

The adhesive property between liquid crystal polymer and metal may deteriorate in an atmosphere of high temperature and high humid, for example, at a temperature of 120° C. and a humidity of 95%. However, in a case that metal has a large surface roughness, the adhesive property between liquid crystal polymer and metal is enhanced due to the anchor effect. When the metal wall 32 has a large surface roughness, the metal wall 32 has a high adhesive property to the seal portion 38. However, if the surface roughness is too large, the electric capacitance varies and the high-frequency characteristic of the ladder type filter may be degraded. From the above consideration, it is preferable that the surface roughness of the metal wall 32 (for example, root-mean-square roughness) is 0.1~10 μm. By forming the metal wall 32 by plating, it is possible to obtain the metal wall 32 having a surface roughness of 0.1~10 μm. It is thus possible to improve the adhesive property between the seal portion 38 and the metal wall 32 and prevents removal of the seal portion 38 even in an atmosphere of high temperature and high humidity.

For example, as illustrated in FIGS. 3A through 3C, the seal portion 38 contacts the upper surfaces of the metal plate 28, the metal wall 32, and the post terminals 42a and 42b. The seal portion 38 contacts the side surfaces of the metal plate 28, the support posts 30, the metal wall 32, and the post terminals 42a and 42b. Generally, the liquid crystal polymer sheet that forms the seal portion 38 has an orientation, as described Document 3. Thus, when the liquid crystal polymer sheet is bonded to a member having a roughness by thermocompression, the orientation of the liquid crystal polymer sheet may be displaced on a side surface of the member. In contrast, the orientation is kept in portions of the liquid crystal polymer sheet that contact the upper surfaces of the above structural parts in parallel. However, the orientation of the liquid crystal polymer sheet may be destroyed in portions that contact the side surfaces of the structural parts. The properties of the liquid crystal polymer sheet that include the hygroscopic property are those under the condition that the liquid crystal polymer sheet is oriented in the sheet extruding direction of the machine. Therefore, the adhesive property of the seal portion 38 with respect to the upper surfaces of the structural parts is higher than that to the side surfaces thereof. Since the seal portion 38 contacts the upper surface 32a of the metal wall 32, it is more difficult for the seal portion 38 from being removed, and an improved hygroscopic property is realized. The upper surface 32a of the metal wall 32 are parallel to the sheet extruding direction of the machine, and are parallel to the orientation direction of the seal portion 38. The orientation direction and the direction of the upper surface 32a may be nearly parallel to each other at an angle of, for example, 5 degrees or less, and is more preferably parallel to each other.

The metal wall 32 may be varied so as not to completely surround the series resonators 12, the parallel resonators 14, the signal lines 20, the ground lines 23, the transmission terminal 22, the antenna terminal 24 and the ground terminals 26. That is, the outer periphery of the piezoelectric substrate 10 may have a portion in which the metal wall 32 is not provided. In this case, however, the outer periphery of the piezoelectric substrate 10 has a portion in which the seal portion 38 is not bonded to the upper surface 32a of the metal wall 32 but is bonded to the side surface of the metal wall 32. Since the liquid crystal polymer sheet has the orientation as has been described previously, the adhesive property between the seal portion 38 and the side surface of the metal wall 32 is lower than that between the seal portion 38 and the upper surface 32a of the metal wall 32. Therefore, there is a possibility that moisture may enter into the device via the interface between the seal portion 38 and the side surface of the metal wall 32. In order to suppress entering of the moisture, it is preferable that the metal wall 32 completely surrounds the series resonators 12, the parallel resonators 14, the signal lines 20, the ground lines 23, the transmission terminal 22, the antenna terminal 24 and the ground terminals 26. It is thus possible to seal the ladder type filter 100 with the seal portion 38 that contacts the upper surface 32a of the metal wall 32 and to effectively increase the hygroscopic property of the ladder type filter 100.

Since the metal wall 32 is provided in the outer periphery of the piezoelectric substrate 10, it is difficult to lead the terminals on the upper surface of the piezoelectric substrate 10 outwards. The transmission terminal 22, the antenna terminal 24 and the ground terminals 26 pierce the seal portion 38, whereby electric connections between the ladder type filter 100 and an external circuit can be made.

The seal portion 38 covers the metal plate 28 supported by the support posts 30. In other words, the metal plate 28 and the support posts 30 support the seal portion 38. Therefore, it is possible to prevent the seal portion 38 from contacting the series resonators 12 and the parallel resonators 14 and secure the cavity 33. It is thus possible to maintain the characteristics of the ladder type filter 100 well. Even in case where the metal plate 28 and the support posts 30 are not provided, the cavity 33 is provided. However, as will be described later in connection with second and third embodiments, pressure may be applied to the seal portion 38 when the ladder type filter 100 is mounted on a printed-circuit board and is sealed with resin. If the seal portion 38 is crushed by pressure, it is difficult to secure the cavity 33. The presence of the metal plate 28 and the support posts 30 prevents the seal portion 38 from being crushed, and easily secures the cavity 33. In order to improve the adhesive property to the seal portion 38, it is preferable that the metal plate 28, and the post terminals 42a and 42b are made of cooper by plating, for example.

As illustrated in FIGS. 10A and 11A through 11C, it is possible to simultaneously perform the step of forming the metal wall 32, the step of forming the metal plate 28, the step of forming the support posts 30 and the step of forming the post terminals 42a and 42b by a plating process in which current is supplied to the seed metal 52.

The ground terminals 26 and the metal wall 32 are electrically connected together, and the metal wall 32 functions as a shield that shields the ladder type filter 100 from external noise. The ladder type filter 100 is not limited to the transmission filter but may be a reception filter. In a case where the ladder type filter 100 is a reception filter, the ladder type filter 100 is equipped with a reception terminal instead of the transmission terminal 22. Passive elements connected to the ladder type filter such as a coil, a capacitor and a transmission line may be integrated. The passive elements may be formed of a metal that is the same as that of the support posts 30 and the metal plate 28 at the same time as the support posts 30 and the metal wall 32 are formed.

Besides the ladder type filter, the present device includes a multimode filter, a dual filter, and a duplexer. Besides the SAW elements, boundary acoustic wave elements or piezoelectric thin-film resonators may be used. For the piezoelectric thin-film resonators, a substrate made of, for example, silicon, is used instead of the piezoelectric substrate 10. Further, the IDT 18 is replaced with a functional portion in which a piezoelectric thin-film is sandwiched between the upper and lower electrodes. The present device includes an electronic component in which a cavity is defined above a functional portion formed on a substrate.

Second Embodiment

Figure 18A:
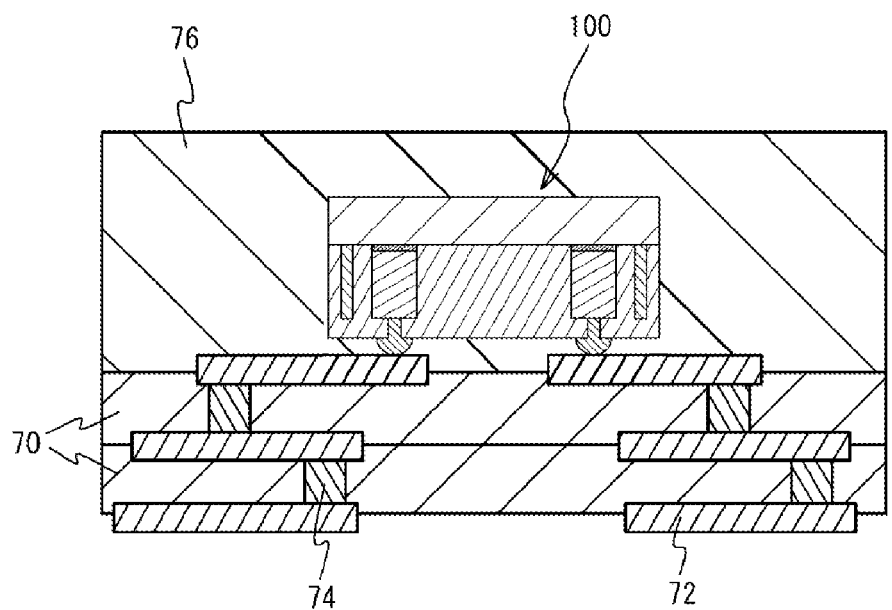
FIG. 18A is a cross-sectional view of an acoustic wave device in accordance with a second embodiment.

A second embodiment is an exemplary acoustic wave device (electronic device) equipped with a ladder type filter. FIG. 18A is a cross-sectional view of an acoustic wave device in accordance with the second embodiment. The cross-sectional view of FIG. 18A is taken along the line C-C in FIG. 1A that illustrates the ladder type filter 100.

Referring to FIG. 18A, an acoustic wave device 200 in accordance with the second embodiment has the ladder type filter 100, printed-circuit boards 70 and molded resin 76. The printed-circuit boards 70 may be made of resin, and have interconnection lines 72. The printed-circuit boards 70 are stacked, and the interconnection lines 72 are interconnected by via interconnections 74. The ladder type filer 100 is electrically connected to the interconnection lines 72 by the solder balls 36. The ladder type filter 100 is flip-chip mounted on the uppermost one of the printed-circuit boards 70. The molded resin 76 with which the ladder type filter 100 is sealed is provided on the uppermost printed-circuit board 70.

According to the second embodiment, the seal portion 38 of the ladder type filter 100 of the acoustic wave device 200 is hardly removed. Thus, the hygroscopic property of the acoustic wave device 200 is improved. The series resonators 12 and the parallel resonators 14 of the ladder type filter 100 are sealed with the molded resin 76 in addition to the seal portion 38, and are protected more effectively.

Third Embodiment

Figure 18B:
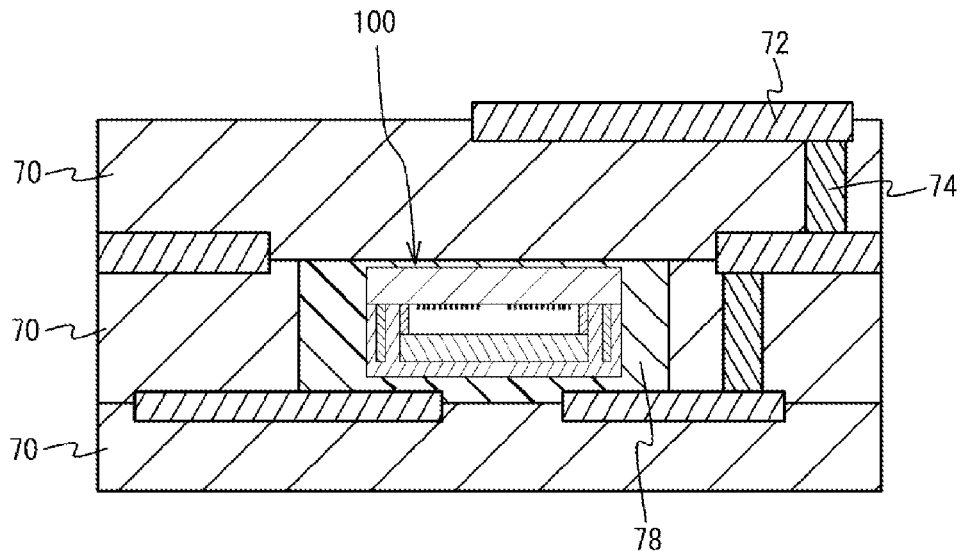
FIG. 18B is a cross-sectional view of an acoustic wave device in accordance with a third embodiment.

A third embodiment is an exemplary acoustic wave device that includes a ladder type filter buried in a printed-circuit board. FIG. 18B is a cross-sectional view of an acoustic wave device in accordance with the third embodiment. The cross-sectional view of FIG. 18B is taken along the line B-B in FIG. 2 that illustrates the ladder type filter 100.

Referring to FIG. 18B, an acoustic wave device 300 of the third embodiment is configured so that the ladder type filter is buried in the printed-circuit board 70. The ladder type filter 100 is covered with an insulative member 78 made of, for example, resin. The ladder type filter 100 is sealed with and fixed by the insulative member 78.

According to the third embodiment, the seal portion 38 of the ladder type filter 100 of the acoustic wave device 300 is hardly removed. Thus, the hygroscopic property of the acoustic wave device 300 is improved. The series resonators 12 and the parallel resonators 14 of the ladder type filter 100 are sealed with the insulative member 78 in addition to the seal portion 38, and are protected more effectively.

The second and third embodiments are not limited to the acoustic wave devices equipped with the ladder type filters that are the transmission filters, but may be acoustic wave devices equipped with a reception filter, a dual filter, a duplexer or the like. The acoustic wave devices may be configured so that passive elements such as a capacitor, an inductor and a transmission line are integrated along with one or more filters The present invention is not limited to the specifically described embodiments, but may include other embodiments and variations without departing from the scope of the claimed invention.

What is claimed is:

1. An electronic component comprising:
    a substrate;
    a functional portion provided on the substrate;
    an interconnection line provided on the substrate and electrically connected to the functional portion;
    a metal wall provided on the substrate so as to surround the functional portion and the interconnection line; and
    a seal portion that contacts the metal wall and covers the functional portion and the interconnection line so as to define a cavity above the functional portion, the seal portion being made of liquid crystal polymer.

2. The electronic component according to claim 1, wherein the metal wall is made of copper.

3. The electronic component according to claim 1, wherein the metal wall has a surface roughness of 0.1~10 μm.

4. The electronic component according to claim 1, wherein the metal wall completely surrounds the functional portion and the interconnection line.

5. The electronic component according to claim 1, wherein the functional portion includes an acoustic wave device.

6. The electronic component according to claim 1, further comprising a metal plate that covers the functional portion so as to define the cavity above the functional portion, wherein the seal portion covers the metal plate.

7. The electronic component according to claim 1, wherein the seal portion has an orientation and contacts an upper surface of the metal wall, and a direction of the orientation of the seal portion is parallel to a direction of the upper surface of the metal wall.

8. The electronic component according to claim 1, further comprising a terminal that is electrically connected to the interconnection line and vertically passes through the seal portion.

9. The electronic component according to claim 8, wherein the terminal includes a ground terminal electrically connected to the metal wall.

10. An electronic device comprising:
a printed-circuit board; and
the electronic component according to claim 1 provided on the printed-circuit board.

11. The electronic device according to claim 10, wherein the electronic component is buried in the printed-circuit board, and the seal portion covers the whole electronic component.

12. A method for manufacturing an electronic component, comprising:
providing, on a substrate, a functional portion and an interconnection line electrically connected to the functional portion;
providing, by plating, a metal wall on the substrate so as to surround the functional portion and the interconnection line;
sealing the functional portion and the interconnection line with a seal portion so as to define a cavity above the functional portion,
the sealing portion being made of liquid crystal polymer and contacting the metal wall.

13. The method according to claim 12, further comprising:
providing, after the providing of the functional portion and the interconnection line, a first resist so as to cover the functional portion and the interconnection line so that an area of the substrate in which the metal wall is to be provided is exposed;
providing a seed metal on the first resist and the area;
providing a second resist on the interconnection line so that an area of the first resist above the functional portion and another area in which the metal wall is to be formed are exposed; and
providing, by plating, a metal plate on the second resist so that the cavity is defined above the functional portion
the providing of the metal wall and the providing the metal plate being simultaneously carried out by a plating process in which current is supplied to the seed metal.

* * * * *